United States Patent
Schäfer et al.

[11] Patent Number: 6,117,790
[45] Date of Patent: Sep. 12, 2000

[54] METHOD FOR FABRICATING A CAPACITOR FOR A SEMICONDUCTOR MEMORY CONFIGURATION

[75] Inventors: Herbert Schäfer, Höhenkirchen-Sieg Brunn; Martin Franosch, München; Reinhard Stengl, Stadtbergen; Gerrit Lange, München; Hans Reisinger, Grünwald; Hermann Wendt, Grasbrunn; Volker Lehmann, München, all of Germany

[73] Assignee: Siemens Aktiengesellschaft, Munich, Germany

[21] Appl. No.: 09/302,655

[22] Filed: Apr. 30, 1999

[30] Foreign Application Priority Data

Apr. 30, 1998 [DE] Germany .................. 198 19 576

[51] Int. Cl.⁷ .................................................. H01L 21/00
[52] U.S. Cl. ..................... 438/712; 438/719; 438/734; 438/754; 438/756
[58] Field of Search ......................... 438/712, 719, 438/734, 754, 756; 216/2, 6, 18, 99, 100

[56] References Cited

U.S. PATENT DOCUMENTS

| | | |
|---|---|---|
| 5,095,346 | 3/1992 | Bae et al. . |
| 5,102,820 | 4/1992 | Chiba . |
| 5,196,364 | 3/1993 | Fazan et al. . |
| 5,459,094 | 10/1995 | Jun . |
| 5,478,770 | 12/1995 | Kim . |

FOREIGN PATENT DOCUMENTS

| | | |
|---|---|---|
| 0 448 374 A1 | 9/1991 | European Pat. Off. . |
| 0448374B1 | 10/1996 | European Pat. Off. . |
| 19546999C1 | 4/1997 | Germany . |
| 19720230A1 | 2/1998 | Germany . |

OTHER PUBLICATIONS

Japanese Patent Abstract No. 08319160 (Katsumi), dated Dec. 3, 1996.
Japanese Patent Abstract No. 10012844 (Tokuo), dated Jan. 16, 1998.
Japanese Patent Abstract No. 10012837 (Tomoshi), dated Jan. 16, 1998.
"A Deep–trenched Capacitor Technology for 4 Mega Bit Dynamic RAM", K. Yamada et al., VLSI Reseach Center, Toshiba Corporation, Japan, 1985, pp. 702–705.

*Primary Examiner*—William Powell
*Attorney, Agent, or Firm*—Herbert L. Lerner; Laurence A. Greenberg; Werner H. Stemer

[57] ABSTRACT

A method for fabricating a capacitor for a semiconductor memory configuration. In this case, a selectively etchable material is applied to a conductive support, which is connected to a semiconductor body via a contact hole in an insulator layer, and patterned. A first conductive layer is applied thereon and patterned. A hole is introduced into the first conductive layer, through which hole the selectively etchable material is etched out. A cavity is produced under the first conductive layer in the process. The inner surface of the cavity and the outer surface of the first conductive layer are provided with a dielectric layer, to which a second conductive layer is applied and patterned.

13 Claims, 3 Drawing Sheets

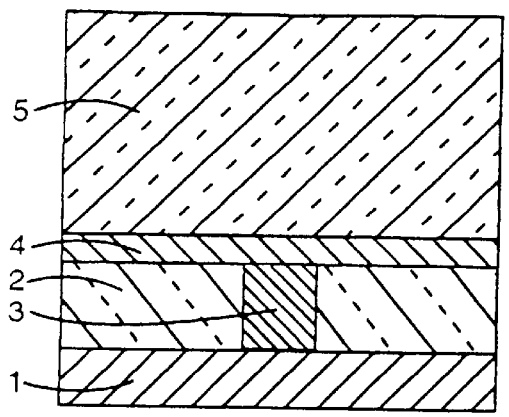
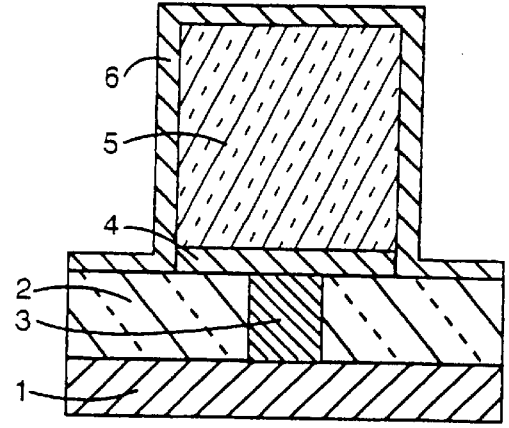
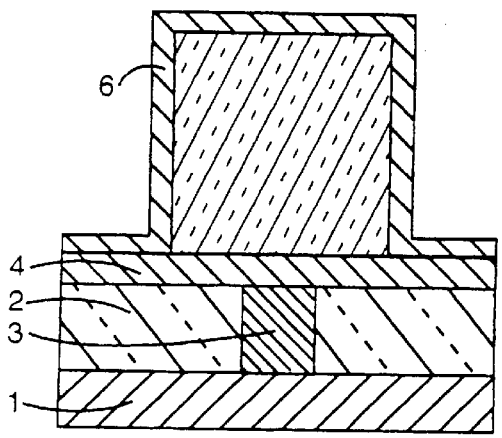
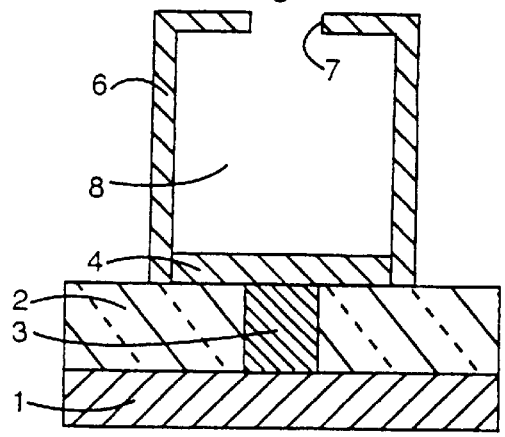
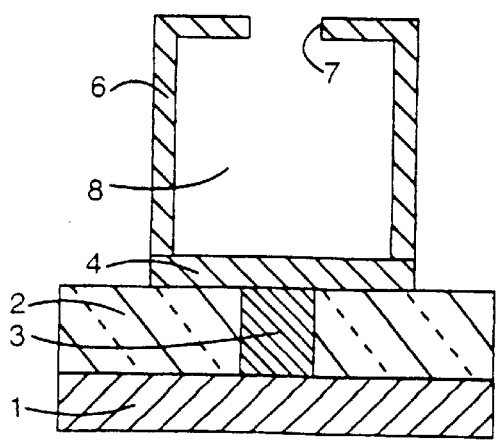
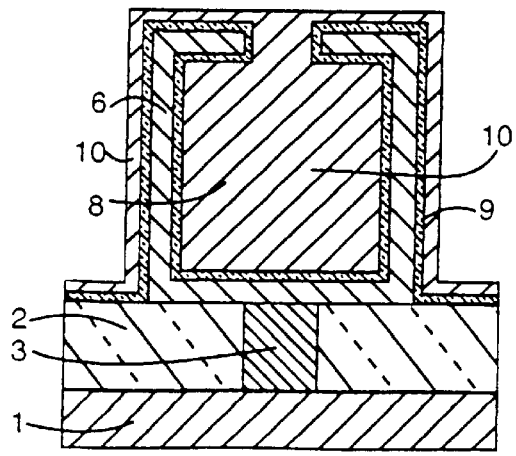

6,117,790

METHOD FOR FABRICATING A CAPACITOR FOR A SEMICONDUCTOR MEMORY CONFIGURATION

BACKGROUND OF THE INVENTION

FIELD OF THE INVENTION

The present invention relates to a method for fabricating a capacitor for a semiconductor memory configuration.

In semiconductor memory configurations such as, by way of example, dynamic random access memories (DRAMs) or ferroelectric random access memories (FRAMs), the area occupied by a storage capacitor should be as small as possible, but the capacitance of the storage capacitor should not fall below a minimum capacitance. In order to achieve this goal, diverse endeavors have already been undertaken to provide capacitors which meet this requirement.

As examples of the various types of capacitors known heretofore, reference shall be made to the below listed references.

German Patent DE 195 46 999 C1, corresponding to U.S. Pat. No. 5,817,553, describes a so-called FIN stacked cell in which, by utilizing the selective etchability of $p^+$-doped polysilicon and $p^-$-doped polysilicon, a lamellar structure made of $p^+$-conducting polysilicon is produced, to which a counterelectrode is applied after the application of an insulating layer. The essentially horizontal lamellae make a substantial contribution to increasing the capacitance of such a capacitor. However, if the space occupied by the capacitor on an integrated circuit becomes smaller and smaller, the contribution of the lamellae to the capacitance decreases in above average fashion.

Furthermore, U.S. Pat. No. 5,196,364 discloses a stacked capacitor in which an electrode is configured in the shape of a finger and, with the interposition of a capacitor layer, is covered with a counterelectrode. In this case, the fingers are spread outward, which admittedly increases the capacitance of such a capacitor but, at the same time, also increases the space requirement of the capacitor on an integrated circuit.

While the two known capacitors described above are provided on an integrated circuit, a trench capacitor disclosed in IEDM 85, pages 702 to 705, is embedded in a semiconductor chip. One electrode of such a trench capacitor is formed by polysilicon that fills the trench and is isolated from the semiconductor chip acting as the counterelectrode by an insulating layer made of silicon dioxide, for example.

U.S. Pat. No. 5,095,346 discloses a so-called advanced block cell for a stacked capacitor in which two polycrystalline silicon layers, which form storage electrodes, are capacitively connected to one another. The respective layers are in this case patterned by etching.

Finally, European Patent EP 0 448 374 B1 also discloses using polycrystalline silicon with a surface which has microroughness in order to increase the capacitance in a capacitor. This surface has a microroughness and silicon grain sizes of between 30 and 50 Å that enables the "plate area" of the capacitor to be readily increased without requiring additional space on the chip area.

As has already been mentioned above, the FIN stacked capacitor is particularly advantageous with regard to the capacitances that can be obtained. If the available area on the semiconductor chip decreases further, however, then the contribution that the lamellae or ribs can afford overall to the capacitance of the capacitor is smaller and smaller, with the result that the gain in capacitance caused by the lamellae or ribs does not necessarily justify the additional outlay required to fabricate the ribs.

SUMMARY OF THE INVENTION

It is accordingly an object of the invention to provide a method for fabricating a capacitor for a semiconductor memory configuration which overcomes the above-mentioned disadvantages of the prior art methods of this general type, in which a small space is formed that allows relatively high capacitances to be obtained without requiring a high outlay in production steps.

With the foregoing and other objects in view there is provided, in accordance with the invention, a method for fabricating a capacitor for a semiconductor memory configuration, which includes:

a) providing a semiconductor body formed of a semiconductor substrate, an insulating layer disposed on the semiconductor substrate, and a conductive support layer disposed on the insulating layer, the insulating layer having a contact hole formed therein connecting the semiconductor substrate to the conductive support layer;

b) applying a selectively etchable material to the conductive support layer;

c) patterning the selectively etchable material resulting in a patterned material;

d) applying a first conductive layer to the patterned material for forming at least part of a first capacitor electrode;

e) patterning the first conductive layer;

f) forming an opening in the first conductive layer covering the patterned material formed from the selectively etchable material;

g) etching out the selectively etchable material resulting in a cavity formed under the first conductive layer;

h) coating an inner surface of the cavity and an outer surface of the first conductive layer with a dielectric layer;

i) applying a second conductive layer to the dielectric layer for forming a second capacitor electrode; and j) patterning the second conductive layer.

In the above step (c), the conductive support lying under the selectively etchable material can also be removed together with the patterning of the selectively etchable material, the insulator layer in this case forming an etching stop. As an alternative, the part of the conductive support is removed in step (e) together with part of the first conductive layer.

In the case of fabricating a capacitor for "high $\epsilon$" or ferroelectric dielectrics, under the conductive layer a barrier layer made of titanium nitride, for example, is additionally provided on the insulator layer made of silicon nitride, for example. Rhodium may also be used, inter alia, instead of titanium nitride.

Typical dimensions of the capacitor fabricated according to the invention are about 150 to 200 nm for the diameter, 100 nm to 2 $\mu$m for the height and 10 to 100 nm for the layer thickness of the dielectric layer.

In this way, a capacitor is fabricated with a semiconductor body on whose surface there are provided a first conductive layer. The first conductive layer forms a first capacitor electrode. A second conductive layer, which is isolated from the first conductive layer by a dielectric layer, is contact-connected on the surface of the semiconductor body and forms a second capacitor electrode. The second conductive layer at least partly filling a space created by the first conductive layer.

The capacitor is furthermore distinguished by the fact that the first conductive layer forms, as the space, a cavity having at least one opening. On the inner and outer surfaces of the cavity the second conductive layer is applied on the dielectric layer, the second conductive layer being interconnected via the at least one opening.

In accordance with a development of the present invention, the first conductive layer is electrically connected to the semiconducting body via a contact hole provided in the insulating layer. Such contact-connection is admittedly known per se. Nonetheless, it enables special advantages in the case of the capacitor fabricated according to the invention. The counterelectrode can then readily be contact-connected after planarization of the surface of the semiconductor memory configuration by an interconnect routed thereon, with the result that the connections of the capacitor are located in the semiconductor body or on an insulating layer provided on the semiconductor body.

Furthermore, it is expedient to roughen the surface of the first conductive layer in order, in this way, to contribute to a further increase in the capacitance of the capacitor. A monocrystalline silicon wafer or a silicon on insulator (SOI) substrate is preferably used as the semiconductor body.

It is preferable to use n or p-doped polycrystalline silicon for the first and/or the second conductive layer. It should be noted, however, that other materials can also be taken into consideration for this purpose.

If it is intended for the capacitor to be fabricated from a "high $\epsilon$" material, such as e.g. barium strontium titanate (BST), or from ferroelectric material, then the first conductive layer is advantageously composed of a metal layer which, for its part, is applied to a barrier layer made of titanium nitride (TiN), for example. Platinum (Pt), for example, can be used for such a metal layer.

Silicon nitride may preferably be used for the insulator layer with the contact hole. This then forms an etching stop, during the patterning of the first conductive layer, if silicon is used for said first conductive layer.

An insulating layer made of silicon nitride and/or silicon dioxide may be used for the dielectric layer of the capacitor, it also being possible, in an advantageous manner, to use for example two silicon dioxide layers separated by a silicon nitride layer (ONO structure). It is also possible to provide tantalum pentoxide for this purpose.

For an FRAM, the dielectric layer is a ferroelectric layer such as, for example, a layer made of strontium bismuth tantalate (SBT).

Other features which are considered as characteristic for the invention are set forth in the appended claims.

Although the invention is illustrated and described herein as embodied in a method for fabricating a capacitor for a semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a to 1f are diagrammatic, sectional views for elucidating a method having two different variants in accordance with a first exemplary embodiment according to the invention;

DESCRIPTION OF THE PREFERRED EMBODIMENTS

Figure 2A:
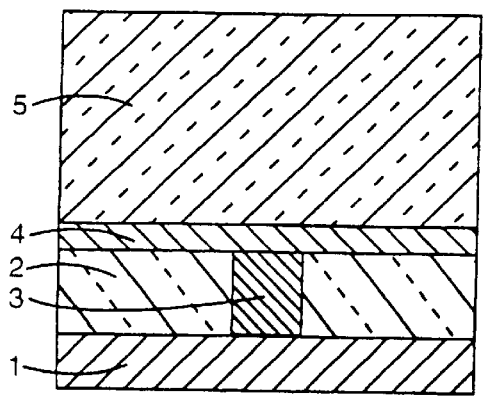
FIGS. 2a to 2f are sectional views for elucidating a method having two different variants in accordance with a second exemplary embodiment.
Figure 2B:
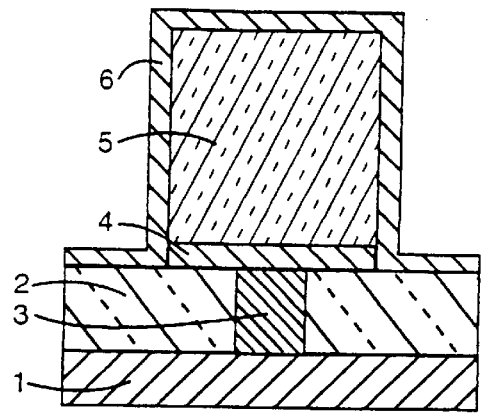
Figure 2C:
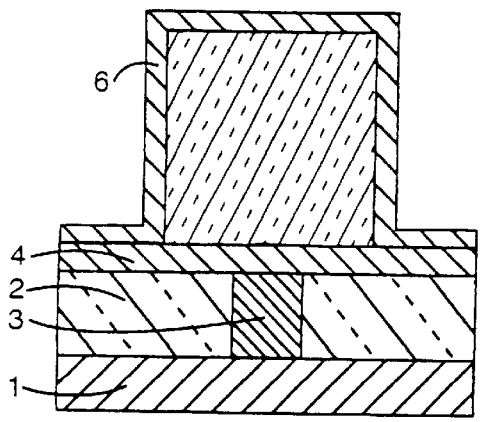
Figure 2D:
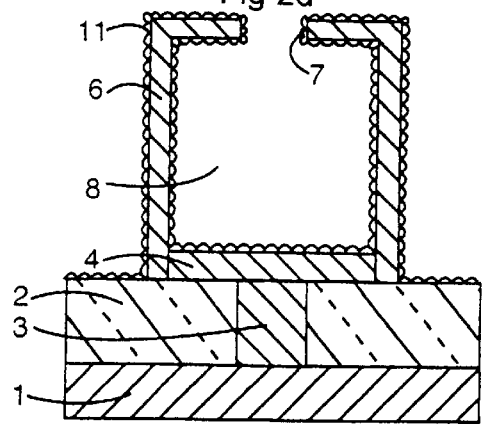
Figure 2E:
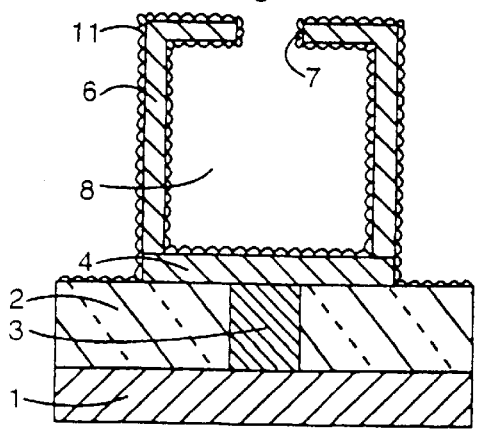
Figure 2F:
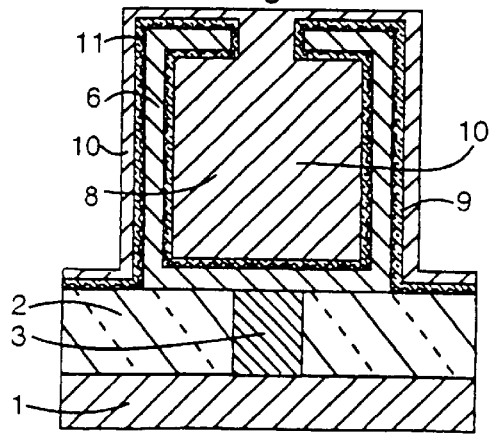

In all the figures of the drawing, sub-features and integral parts that correspond to one another bear the same reference symbol in each case. Referring now to the figures of the drawings in detail and first, particularly, to FIG. 1a thereof, there is shown a semiconductor substrate 1 made of silicon, on which an insulator layer 2 made of silicon nitride is provided. The insulator layer 2 has a contact hole 3, via which a conductive layer 4 made of doped polycrystalline silicon, for example, is connected to the semiconductor substrate 1. In other words, the contact hole 3 is filled with the material of the conductive layer 4, that is to say with doped polycrystalline silicon in the present example.

The application of the polycrystalline silicon may be carried out by vapor phase deposition (CVD), for example.

A further layer 5 made of silicon dioxide (TEOS), which further layer 5 is selectively etchable with respect to the material of the insulator layer 2, is subsequently applied to the configuration thus fabricated. Other materials may also be chosen for the layers 2 and 5. However, the layers should be selectively etchable with respect to one another.

The layer thickness of the further layer 5 is set depending on the desired capacitance. Thus, the layer thickness may be between 100 nm and 2 $\mu$m, for example. The configuration shown in FIG. 1a is thus obtained.

Then, as is shown in FIG. 1b, the further layer 5 is patterned by reactive ion etching, for example, to the desired size. During the patterning, part of the conductive layer 4 is also removed together with the further layer 5, with the result that only the conductive layer 4 lying under the further layer 5 is left behind. A conductive layer 6 is subsequently applied; this layer may be composed of the same material as the conductive layer 4. That is to say, in the present exemplary embodiment, doped polycrystalline silicon is once again used for the conductive layer 6.

In this way, a structure is obtained on the surface of the insulator layer 2, in which structure the parallelepipedal or cylindrical or else differently configured further layer 5 is enclosed on all sides by the conductive layers 4, 6, as is shown in FIG. 1b.

The conductive layer 6 is then removed outside the "parallelepiped" (or the differently configured structure), and a hole 7 is introduced into the conductive layer 6 in the "lid" of the parallelepiped. This may be done by reactive ion etching, if appropriate. Through the hole 7, the further layer 5 in the parallelepiped, in other words the layer 5 made of silicon dioxide or TEOS in the present exemplary embodiment, is etched out using a wet etching solution which is selective with respect to the conductive layers 4, 6, for example hydrofluoric acid, a cavity 8 thereby being produced. The structure shown in FIG. 1d is thus present.

The inner surfaces of the cavity 8 and also the outer surfaces of the conductive layer 6 are then coated with a dielectric layer 9 made of ONO, for example. A conductive counterelectrode 10 made of doped polycrystalline silicon, for example, is subsequently applied in such a way that the counterelectrode 10 at least partly fills the cavity 8 as well.

FIGS. 1c and 1e show a variant of the method just explained: during the patterning of the further layer 5 made of silicon dioxide (TEOS), for example, the conductive layer 4 is left and not etched away, with the result that the conductive layer 6 is also applied to the conductive layer 4 outside the "parallelepiped" (cf. FIG. 1c). In return, the conductive layer 4 is removed outside the parallelepiped together with the conductive layer 6 lying on top of it during the patterning of the conductive layer 6 in order to produce the hole 7, as is shown in FIG. 1e.

The capacitor, which is shown in FIG. 1f, is distinguished by the fact that its electrodes have a large surface area, and thus by a large capacitance. In this capacitor, the inner space of a parallelepiped (or of a differently configured structure) formed by a first electrode is advantageously utilized in order to increase the capacitor area to a considerable extent. Lamellar structures or the like, whose contribution to the capacitor area becomes smaller and smaller as the base area decreases, are not used for this purpose.

FIGS. 2a–2f show another advantageous exemplary embodiment of the capacitor fabricated according to the invention, or steps for fabricating the capacitor. In this case, FIGS. 2a to 2f respectively correspond to FIGS. 1a to 1f.

In contrast to the exemplary embodiment of FIGS. 1a–1f, however, the exemplary embodiment of FIGS. 2a–2f (cf., in particular, FIGS. 2d to 2f thereof) uses a so-called roughened or "rugged" polycrystalline silicon, which has an enlarged surface area 11. The polycrystalline silicon with an enlarged surface area 11 can, for example, be deposited onto the layers 4 and 6 by low pressure CVD (LPCVD) at 500 to 620° C. and pressure of 1330 Pa–1.3 Pa (10 to 0.01 tore) after the patterning of the cavity 8. The remaining method steps correspond to the exemplary embodiment of FIG. 1.

Finally, FIGS. 3a to 3f show a method for fabricating a capacitor for "high ε" or ferroelectrics, the dielectric layer 9 being composed of, for example, barium strontium titanate or tantalum pentoxide or SBT, and not of ONO as in FIGS. 1a–1f and 2a–2f. In the exemplary embodiment of FIGS. 3a–3f, moreover, a barrier layer 12 made of titanium nitride (TiN), for example, is applied to the insulator layer 2 with the contact hole 3, the conductive layer 4 made of platinum, for example, then being formed on the barrier layer 12. The layers 12 and 4 may in this case be produced by CVD or sputtering.

There then follows, as in the exemplary embodiments of FIGS. 1a and 2a, the application of the selectively etchable further layer 5 made of silicon dioxide (TEOS), for example, the layer thickness of which is once again defined in accordance with the desired capacitance. As in the exemplary embodiments of FIGS. 1a–1f and 2a–2f, the further layer 5 is patterned and has a conductive layer 6 made, for example, of the same material as the layer 4, that is to say platinum, grown on it.

The barrier layer 12 and the conductive layers 4, 6 are then patterned with the aid of a mask, and the hole 7 is produced in the conductive layer 6 in the lid of the resultant "parallelepiped" (or differently configured structure). Through the hole 7, the further layer 5, which is composed of silicon dioxide in the present exemplary embodiment, is once again etched out, as in the examples of FIGS. 1a–1f and 2a–2f, using a wet etching solution which is selective with respect to the layer 4 and/or 6 and is composed of hydrofluoric acid, for example.

The cavity 8 formed by the conductive layers 4 and 6 is coated with the dielectric layer 9, as are the outer surfaces of the conductive layers 6. In the present exemplary embodiment, the dielectric layer 9 is composed of barium strontium titanate or SBT. However, it is also possible to choose other ferroelectrics or tantalum pentoxide. There then follows, as in the exemplary embodiments of FIGS. 1a–1f and 2a–2f, the application of the conductive counterelectrode 10, which may be done by CVD, for example. Finally, the counterelectrode is patterned, for which purpose reactive ion etching may also be used in this case.

Figure 3A:
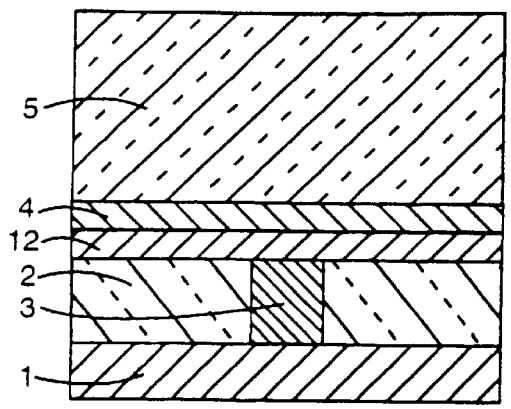
FIGS. 3a to 3f are sectional views for elucidating a method having two different variants in accordance with a third exemplary embodiment.
Figure 3B:
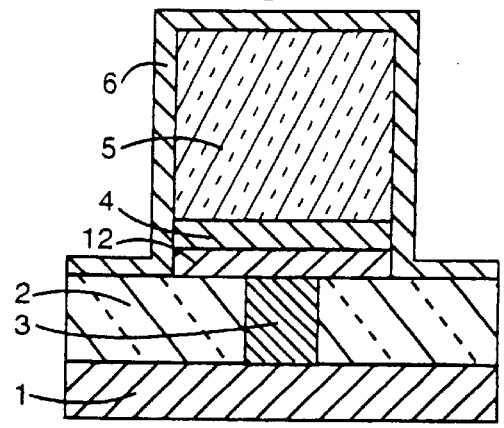
Figure 3C:
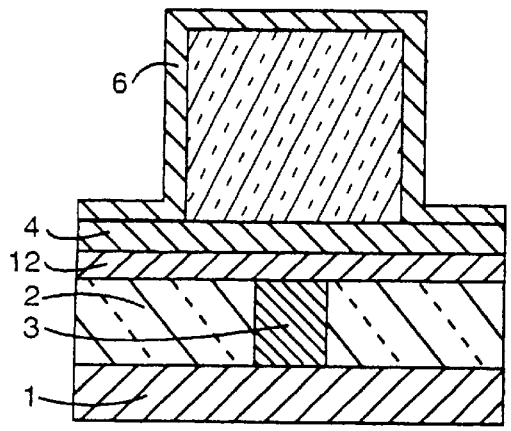
Figure 3D:
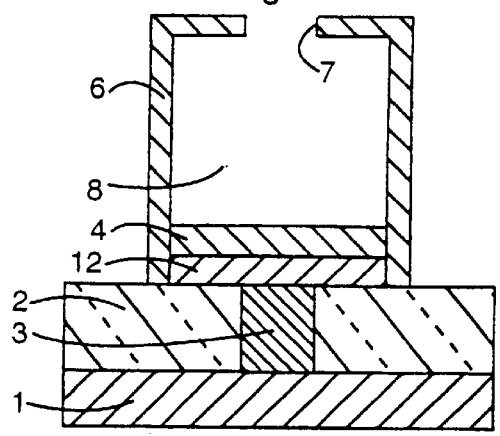
Figure 3E:
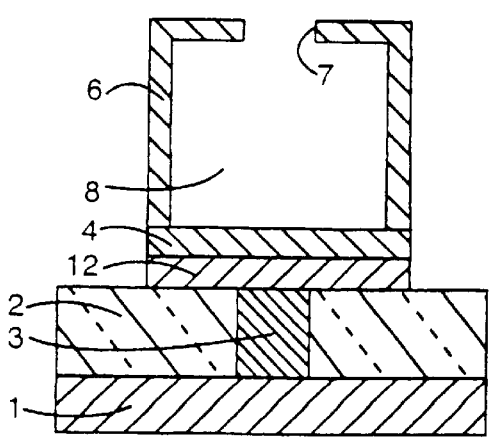
Figure 3F:
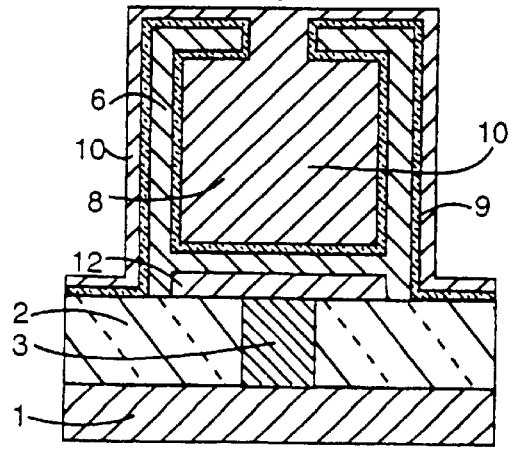

As in the exemplary embodiments of FIGS. 1a–1f and 2a–2f, it is also possible in the exemplary embodiment of FIGS. 3a–3f to remove the layers 4 and 12 outside the patterned further layer 5 together with the latter (variant of FIGS. 3b and 3d) or else to remove the layers 4 and 12 outside the patterned further layer 5 together with the conductive layer 6 (variant of FIGS. 3c and 3e).

The invention makes it possible to fabricate a capacitor having very small dimensions yet a large capacitor area in conjunction with a small required base area. The dielectric layer 9 may have a layer thickness of down to 20 nm.

In the method according to the invention, a hole is introduced for the first time into a preferably parallelepipedal structure made of the conductive layers 4, 6, which structure is initially filled with the material of the further layer 5. The material being selectively etchable with respect to the material of the layers 4, 6, in order in this way to form a cavity in the parallelepiped by etching, the inner surface of which cavity is then utilized for the purpose of increasing the capacitor area. The hole 7 may be formed by reactive ion etching, for example.

We claim:

1. A method for fabricating a capacitor for a semiconductor memory configuration, which comprises:
    a) providing a semiconductor body formed of a semiconductor substrate, an insulating layer disposed on the semiconductor substrate, and a conductive support layer disposed on the insulating layer, the insulating layer having a contact hole formed therein connecting the semiconductor substrate to the conductive support layer;
    b) applying a selectively etchable material to the conductive support layer;
    c) patterning the selectively etchable material resulting in a patterned material;
    d) applying a first conductive layer to the patterned material for forming at least part of a first capacitor electrode;
    e) patterning the first conductive layer;
    f) forming an opening in the first conductive layer covering the patterned material formed from the selectively etchable material;
    g) etching out the selectively etchable material resulting in a cavity formed under the first conductive layer;
    h) coating an inner surface of the cavity and an outer surface of the first conductive layer with a dielectric layer;
    i) applying a second conductive layer to the dielectric layer for forming a second capacitor electrode; and
    j) patterning the second conductive layer.

2. The method according to claim 1, which comprises removing regions of the conductive support layer which are bare of the patterned material during step c).

3. The method according to claim 1, which comprises removing together with the first conductive layer parts of the conductive support lying under removed regions of the first conductive layer during step e).

4. The method according to claim 1, which comprises electrically connecting the first conductive layer to the semiconductor substrate via the contact hole formed in the insulator layer.

5. The method according to claim 1, which comprises forming the first conductive layer with a roughened surface.

6. The method according to claim 1, which comprises forming at least one of the first conductive layer and the second conductive layer from polycrystalline silicon.

7. The method according to claim 1, which comprises forming the first conductive layer from a metal layer applied to a barrier layer.

8. The method according to claim 7, which comprises forming the metal layer from platinum and the barrier layer from titanium nitride.

9. The method according to claim 4, which comprises forming the insulator layer from silicon nitride.

10. The method according to claim 1, which comprises forming the dielectric layer from layer sequences containing silicon nitride and silicon dioxide.

11. The method according to claim 7, which comprises forming the dielectric layer from a material selected from the group consisting of a ferroelectric layer and a "high $\epsilon$" layer.

12. The method according to claim 11, which comprises forming the ferroelectric layer from strontium bismuth tantalate.

13. The method according to claim 7, which comprises forming the dielectric layer from tantalum pentoxide.

* * * * *